United States Patent
Marchack et al.

(10) Patent No.: US 10,727,398 B1
(45) Date of Patent: Jul. 28, 2020

(54) MTJ CONTAINING DEVICE CONTAINING A BOTTOM ELECTRODE EMBEDDED IN DIAMOND-LIKE CARBON

(71) Applicant: International Business Machines Corporation, Armonk, NY (US)

(72) Inventors: Nathan P. Marchack, New York, NY (US); Bruce B. Doris, Slingerlands, NY (US); Chandrasekharan Kothandaraman, New York, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/262,437

(22) Filed: Jan. 30, 2019

(51) Int. Cl.
*H01L 43/02* (2006.01)
*H01L 43/12* (2006.01)

(52) U.S. Cl.
CPC .............. *H01L 43/02* (2013.01); *H01L 43/12* (2013.01)

(58) Field of Classification Search
CPC ................................ H01L 43/02; H01L 43/12
See application file for complete search history.

(56) References Cited

U.S. PATENT DOCUMENTS

| | | | |
|---|---|---|---|
| 8,742,387 B2 | 6/2014 | Happ et al. | |
| 8,796,041 B2 | 8/2014 | Assefa et al. | |
| 8,956,882 B1 | 2/2015 | Tomioka et al. | |
| 9,236,069 B2 | 1/2016 | Braganca et al. | |
| 9,450,180 B1 | 9/2016 | Annunziata et al. | |
| 9,705,071 B2 | 7/2017 | Annunziata et al. | |
| 9,917,137 B1* | 3/2018 | Briggs | H01L 27/222 |
| 2009/0091037 A1* | 4/2009 | Assefa | H01L 43/12 257/773 |
| 2010/0097846 A1 | 4/2010 | Sugiura et al. | |
| 2015/0372225 A1 | 12/2015 | Gaidis et al. | |
| 2017/0077388 A1 | 3/2017 | Tsubata et al. | |
| 2018/0197915 A1 | 7/2018 | Briggs et al. | |

OTHER PUBLICATIONS

U.S. Appl. No. 16/127,384 entitled "Contact via Structures" filed Sep. 11, 2018, First Named Inventor: Chih-Chao Yang, 27 pages.

* cited by examiner

*Primary Examiner* — Seahvosh Nikmanesh
(74) *Attorney, Agent, or Firm* — Scully, Scott, Murphy & Presser, P.C.

(57) ABSTRACT

A magnetic tunnel junction (MTJ) containing device is provided in which a bottom electrode having a small CD is formed and is located laterally adjacent to diamond like carbon (DLC). DLC replaces a material stack of, from bottom to top, a silicon nitride layer and an organic planarization layer (OPL) which is typically used in providing a conductive structure having a reduced CD. DLC provides a higher etch resistance to IBE than silicon nitride, but DLC can be patterned using conventional etchants. The use of DLC thus reduces the number of processing steps for providing a reduced CD bottom electrode, and also provides a more robust solution to the issue of punch through to an underlying conductive material layer.

10 Claims, 3 Drawing Sheets

US 10,727,398 B1

MTJ CONTAINING DEVICE CONTAINING A BOTTOM ELECTRODE EMBEDDED IN DIAMOND-LIKE CARBON

BACKGROUND

The present application relates to a magnetic tunnel junction (MTJ) containing device and a method of forming the same. More particularly, the present application relates to a MTJ containing device that includes diamond-like carbon laterally adjacent to a bottom electrode.

Magnetoresistive random access memory (MRAM) is a non-volatile random access memory technology in which data is stored by magnetic storage elements. These elements are typically formed from two ferromagnetic plates, each of which can hold a magnetization, separated by a thin dielectric layer, i.e., the tunnel barrier. One of the two plates is a permanent magnetic set to a particular polarity; the other plate's magnetization can be changed to match that of an external field to store memory. Such a configuration is known as a magnetic tunnel junction (MTJ) pillar.

In such MTJ containing devices, the bottom electrode that is connected to the MTJ pillar can be a source of resputtered conductive metal particles that can deposit on a sidewall of the MTJ pillar, especially when an ion beam etching (IBE) process is used to clean the sidewall of the MTJ pillar. If resputtered conductive metal particles deposit on the tunnel barrier material of the MTJ pillar, electrical shorts may arise, which is a common failure mode. This problem is particularly apparent when the critical dimension (CD) of the bottom electrode exceeds that of the MTJ pillar, which is not an unlikely occurrence due to the difficulty in maintaining circularity at small CDs for hole features.

There is thus a need for providing a MTJ containing device that includes a MTJ pillar located on a bottom electrode that has a reduced CD.

SUMMARY

A magnetic tunnel junction (MTJ) containing device is provided in which a bottom electrode having a small CD is formed and is located laterally adjacent to diamond like carbon (DLC). The term "critical dimension" is used throughout the present application to denote a diameter of a feature. DLC replaces a material stack of, from bottom to top, a silicon nitride layer and an organic planarization layer (OPL) which is typically used in providing a conductive structure having a reduced CD. DLC provides a higher etch resistance to IBE than silicon nitride, but DLC can be patterned using conventional etchants. The use of DLC thus reduces the number of processing steps for providing a reduced CD bottom electrode, and also provides a more robust solution to the issue of punch through to an underlying conductive material layer.

In one aspect of the present application, a magnetic tunnel junction (MTJ) containing device is provided. The MTJ containing device may be a memory device or a sensor. In one embodiment, the MTJ containing device includes a MTJ pillar located on a topmost surface of a bottom electrode. A diamond like carbon (DLC) layer is located laterally adjacent to the bottom electrode, and a top electrode is located on the MTJ pillar.

In another embodiment, a method of forming a magnetic tunnel junction (MTJ) containing device is provided. In one embodiment, the method includes forming a material stack on a surface on an interconnect level, wherein the material stack includes, from bottom to top, a diamond-like carbon (DLC) layer, a dielectric mask layer, and a patterned photoresist having an opening located therein. Next, the opening present in the patterned photoresist is transferred into the dielectric mask layer to provide a patterned dielectric mask having a tapered opening. An opening is then formed into the DLC layer utilizing an etch that also removes the patterned photoresist. After this etch, the patterned dielectric mask is removed. A bottom electrode is then formed in the opening that is present in the DLC layer.

DETAILED DESCRIPTION

Figure 2:
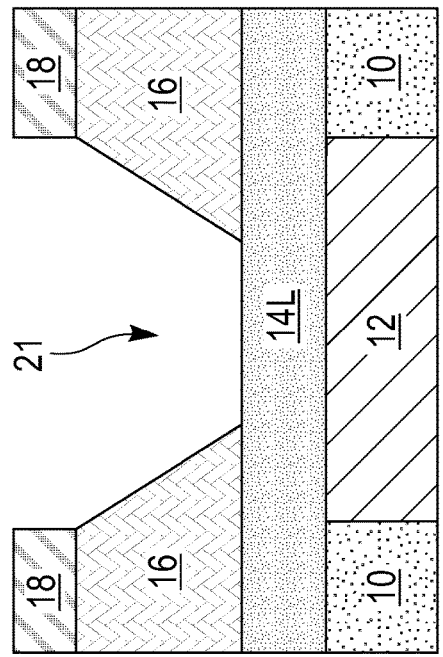
FIG. 2 is a cross sectional view of the exemplary MTJ containing device of FIG. 1 after transferring the opening into the dielectric mask layer to provide a patterned dielectric mask having a tapered opening located therein.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Figure 1:
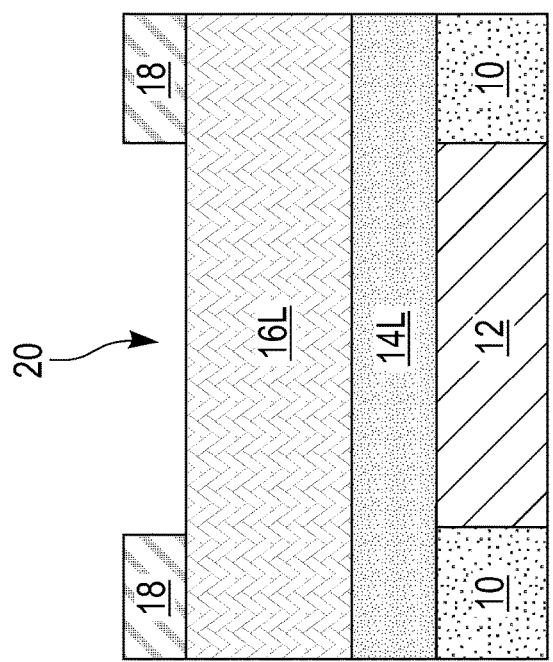
FIG. 1 is a cross sectional view of an exemplary MTJ containing device of the present application and during an early stage of fabrication, the MTJ containing device including an interconnect level containing an electrically conductive structure embedded in an interconnect dielectric material layer, and a material stack located on the interconnect level, wherein the material stack includes, from bottom to top, a diamond-like carbon (DLC) layer, a dielectric mask layer, and a patterned photoresist having an opening located therein.

Referring now to FIG. 1, there is illustrated an exemplary MTJ containing device of the present application and during an early stage of fabrication. Exemplary MTJ containing devices include, but are not limited to, memory devices (e.g., MRAM or spin-transfer torque (STT) MRAM), or sensors such as, for example, pressure sensors. Notably, the exemplary MTJ containing device shown in FIG. 1 includes an interconnect level containing an electrically conductive structure 12 embedded in an interconnect dielectric material layer 10, and a material stack located on the interconnect level, wherein the material stack includes, from bottom to top, a diamond-like carbon (DLC) layer 14, a dielectric mask layer 16L, and a patterned photoresist 18 having an opening 20 located therein.

It is noted that the drawings of the present application illustrate a device area in which a MTJ containing device will be formed. A non-MTJ containing device area may be located adjacent to the MTJ containing device area illustrated in the drawings of the present application. It is also noted that while a single opening 20 is described and illustrated as being formed into a photoresist material that provides patterned photoresist 18, the present application can be used when a plurality of openings 20 are formed. In such an embodiment, each opening is located above an electrically conductive structure 12 that is embedded in interconnect dielectric material layer 10 and defines an area in which a MTJ pillar and a top electrode will be subsequently formed. It is further noted that at least one other interconnect level and/or a middle-of-the-line (MOL) level may be located beneath the interconnect level including the interconnect dielectric material layer 10 and the electrically conductive structure 12. These other levels are not shown for clarity.

The interconnect dielectric material layer 10 can be composed of any interconnect dielectric material including, for example, silicon dioxide, silsesquioxanes, C doped oxides (i.e., organosilicates) that includes atoms of Si, C, O and H, thermosetting polyarylene ethers, or multilayers thereof. The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl and the like.

The electrically conductive structure 12 is composed of an electrically conductive metal or metal alloy. Examples of electrically conductive materials that may be used in the present application include copper (Cu), aluminum (Al), or tungsten (W), while an example of an electrically conductive metal alloy is a Cu—Al alloy.

In some embodiments, a diffusion barrier liner is formed along the sidewalls and a bottom wall of the electrically conductive structure 12. In some embodiments, no diffusion barrier liner is present. The diffusion barrier liner is composed of a diffusion barrier material (i.e., a material that serves as a barrier to prevent a conductive material such as copper from diffusing there through). Examples of diffusion barrier materials that can be used in providing the diffusion barrier liner include, but are not limited to, Ta, TaN, Ti, TiN, Ru, RuN, RuTa, RuTaN, W, or WN. In some embodiments, the diffusion barrier material may include a material stack of diffusion barrier materials. In one example, the diffusion barrier material may be composed of a stack of Ta/TaN.

The interconnect level including the interconnect dielectric material layer 10, the electrically conductive structure 12, and, if present, the diffusion barrier liner may be formed utilizing conventional processes that are well-known to those skilled in the art including, for example, a damascene process. So as not to obscure the method of the present application, the techniques used to form the interconnect level including the interconnect dielectric material layer 10, the electrically conductive structure 12, and, if present, the diffusion barrier liner are not provided herein.

After providing the interconnect level including the interconnect dielectric material layer 10, the electrically conductive structure 12, and, if present, the diffusion barrier liner, the DLC layer 14 of the material stack is formed. The term "diamond like carbon" denotes a class of amorphous carbon material that contains a high content of $sp^3$ hybridized carbon atoms and displays some of the typical properties such as, for example, high mechanical hardness, and high electrical resistivity, as diamond. DLC also has a higher etch resistance to IBE than silicon nitride.

The DLC layer 14 is a continuous layer that is formed upon the entirety of the interconnect level including the interconnect dielectric material layer 10, the electrically conductive structure 12, and, if present, the diffusion barrier liner. The DLC layer 14 can be formed by a conventional deposition process such as, for example, physical vapor deposition (PVD) or chemical vapor deposition (PECVD). The DLC layer 14 can have a thickness from 5 nm to 25 nm; other thicknesses are possible and can be used in the present application as the thickness of the DLC layer 14. The DLC layer 14 will be used to embed a subsequently formed bottom electrode having a small CD therein. As stated above, the use of the DLC layer 14 replaces a material stack of, from bottom to top, a silicon nitride layer and an organic planarization layer (OPL) which is typically used in providing a conductive structure having a reduced CD (see, for example, co-assigned U.S. application Ser. No. 16/127,384 to Yang et al., filed Sep. 11, 2018).

The dielectric mask layer 16L of the material stack is a continuous layer that is formed on a physical exposed surface of the DLC layer 14. The dielectric mask layer 16L can serve as a mask to pattern the DLC layer 14. In one embodiment, the dielectric mask layer 16L is composed of a Si-containing material such as, for example, a low-temperature oxide ($SiO_x$), a Si-containing antireflection layer (SiARC), or SiN. In another embodiment, the dielectric mask layer 16L may be a low k dielectric material (i.e., a dielectric material that has a dielectric constant, k, of less than 4.0).

The dielectric mask layer 16L may be formed by a conventional deposition process such as, for example, chemical vapor deposition (CVD), plasma enhanced chemical vapor deposition (PECVD) or spin-on coating. The dielectric mask layer 16L can have a thickness from 25 nm to 100 nm; other thicknesses are possible and can be used in the present application as the thickness of the dielectric mask layer 16L.

The patterned photoresist 18 may be composed of a conventional photoresist material including positive-tone photoresist materials, negative-tone photoresist materials and hybrid-tone photoresist materials. The patterned photoresist 18 may be formed by first providing a blanket layer of photoresist material utilizing a deposition process such as, for example, chemical vapor deposition (CVD), plasma enhanced chemical vapor deposition (PECVD), or spin-coating. After providing the blanket layer of photoresist material, a lithographic process is used to pattern the blanket layer of photoresist material. The opening 20 located in the patterned photoresist 18 has a first dimension.

Referring now to FIG. 2, there is illustrated the exemplary MTJ containing device of FIG. 1 after transferring the opening 20 into the dielectric mask layer 16L to provide a patterned dielectric mask 16 having a tapered opening 21 located therein. This transferring step of the present application may use a partially-polymerizing reactive ion etch (RIE) process. The tapered opening 21 that is formed in the patterned dielectric mask 16 has a dimension (i.e., second dimension) that decreases from top to bottom as is shown in FIG. 2. The dimension of an upper proportion of the tapered opening 21 is substantially the same (i.e., ±10%) as the first dimension of opening 20 that is present in the patterned photoresist 18. The dimension of a lower portion of the tapered opening 21 can be 3 to 4 times less than the dimension at the upper portion of the tapered opening 21, depending on the thickness of dielectric mask layer 16L.

Figure 3:
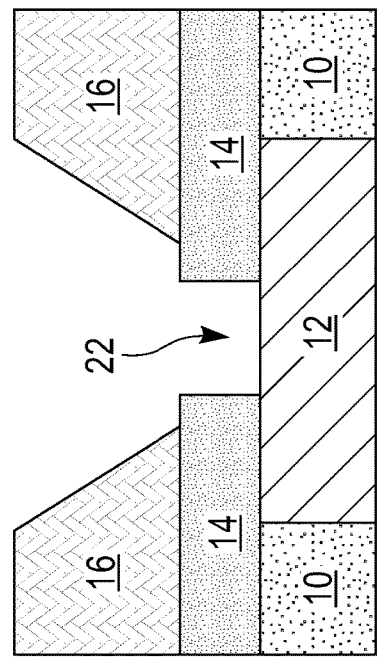
FIG. 3 is a cross sectional view of the exemplary MTJ containing device of FIG. 2 after forming an opening into the DLC layer utilizing an etch that also removes the patterned photoresist.

Referring now to FIG. 3, there is illustrated the exemplary MTJ containing device of FIG. 2 after forming an opening 22 into the DLC layer 14. The opening 22 is formed utilizing an etching process that is selective in removing DLC as compared to the dielectric material that provides the dielectric mask layer 16L and the conductive material that provides the electrically conductive structure 12. The patterned dielectric mask 16 serves as an etch mask during this etch. The patterned photoresist 18 is removed from the structure during this etch.

The etching process that is used in forming the opening 22 into the DLC layer 14 may include a plasma etch or a reactive ion etch. The etching process used in forming the opening 22 into the DLC layer 14 may include an admixture of oxygen and nitrogen, or an admixture of nitrogen and hydrogen. The opening 22 that is formed in the DLC layer 14 has a dimension that is equal to, or smaller than, the dimension of the lower portion of the tapered opening 21. In one example, the dimension of the opening 22 may be from 20 nm to 60 nm. Opening 22 physically exposes a topmost surface of the electrically conductive structure 12 that is embedded in the interconnect dielectric material layer 10.

Figure 4:
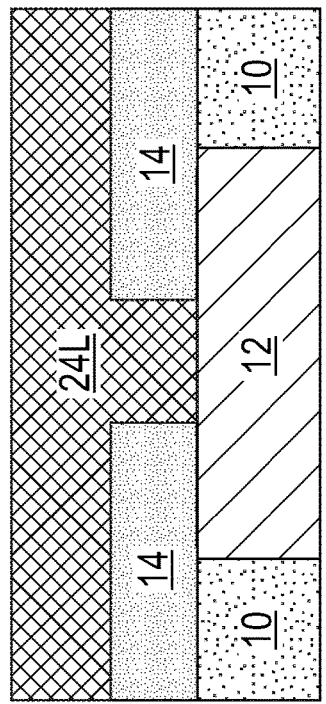
FIG. 4 is a cross sectional view of the exemplary MTJ containing device of FIG. 3 after removing the patterned dielectric mask.

Referring now to FIG. 4, there is illustrated the exemplary MTJ containing device of FIG. 3 after removing the patterned dielectric mask 16. The patterned dielectric mask 16 can be removed utilizing an etching process that is selective in removing the dielectric material that provides the patterned dielectric mask 16. In one example, the patterned dielectric mask 16 can be removed by etching in dilute hydrofluoric acid (DHF). In another example, the patterned dielectric mask 16 can be removed utilizing a buffered oxide etchant that includes an admixture of ammonium fluoride and hydrofluoric acid.

Figure 5:
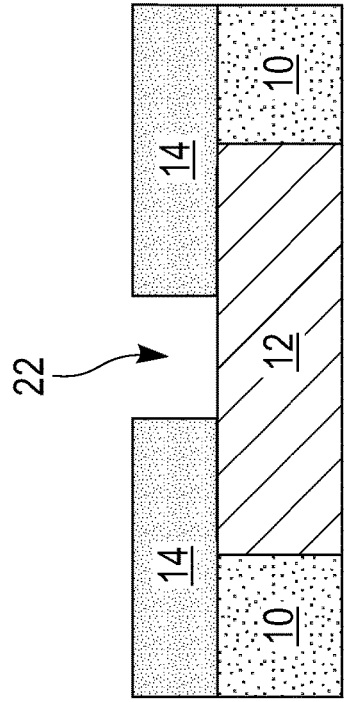
FIG. 5 is a cross sectional view of the exemplary MTJ containing device of FIG. 4 after forming a conductive material layer on the DLC layer and within the opening present in the DLC layer.

Referring now to FIG. 5, there is illustrated the exemplary MTJ containing device of FIG. 4 after forming a conductive material layer 24L on the DLC layer 14 and within the opening 22 present in the DLC layer 14. The conductive material layer 24L is composed of a conductive material such as, for example, Ta, TaN, Ti, TiN, Ru, RuN, RuTa, RuTaN, Co, CoWP, CoN, W, WN or any combination thereof. The conductive material layer 24L may be formed by a deposition process such as, for example, sputtering, atomic layer deposition (ALD), chemical vapor deposition (CVD), plasma enhanced chemical vapor deposition (PECVD) or physical vapor deposition (PVD).

Figure 6:
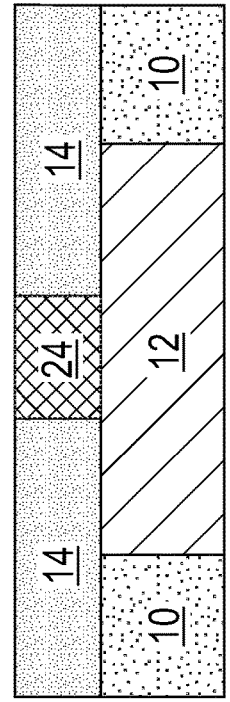
FIG. 6 is a cross sectional view of the exemplary MTJ containing device of FIG. 5 after removing the conductive material layer that is located on the topmost surface of the DLC layer and outside the opening that is present in the DLC layer, while maintaining the conductive material layer in the opening present in the DLC layer to provide a bottom electrode having a small critical dimension.

Referring now to FIG. 6, there is illustrated the exemplary MTJ containing device of FIG. 5 after removing the conductive material layer 24L that is located on the topmost surface of the DLC layer 14 and outside the opening 22 that is present in the DLC layer 14, while maintaining the conductive material layer 24L in the opening 22 present in the DLC layer 14 to provide a bottom electrode 24 having a small critical dimension. The removal of the conductive material layer 24L that is located on the topmost surface of the DLC layer 14 and outside the opening 22 that is present in the DLC layer 14 can be performed utilizing a planarization process such as, for example chemical mechanical polishing (CMP).

The bottom electrode 24 completely fills in the opening 22 and has a topmost surface that is coplanar with a topmost surface of the DLC layer 14 that is located laterally adjacent to the bottom electrode 24. The bottom electrode 24 has a bottommost surface that is coplanar with a bottommost surface of the DLC layer 14 that is located laterally adjacent to the bottom electrode. 24, and the bottommost surface of the bottom electrode 24 is in direct physically contact with the topmost surface of the underlying electrically conductive structure 12. The bottom electrode 24 has a critical dimension that is the same as the dimension of opening 22; i.e., from 20 nm to 60 nm.

Figure 7:
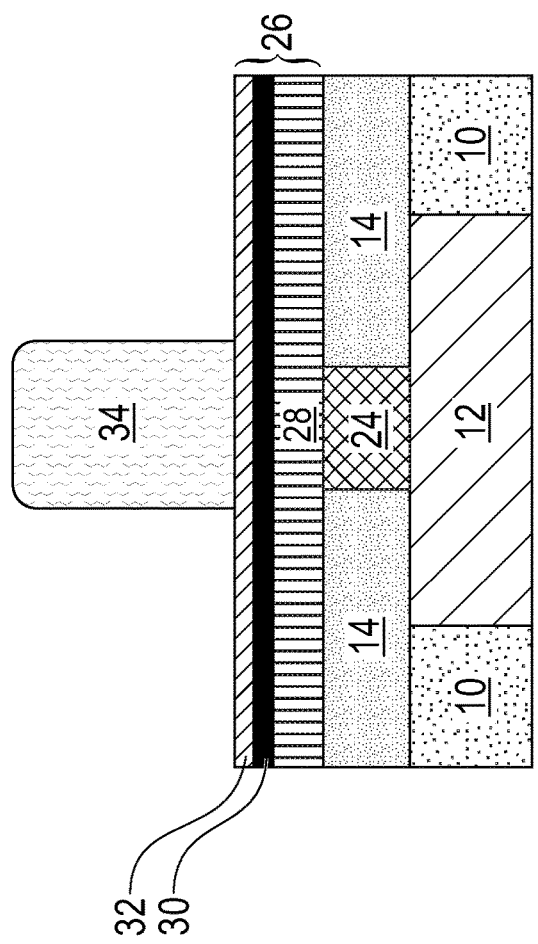
FIG. 7 is a cross sectional view of the exemplary MTJ containing device of FIG. 6 after forming a multilayered MTJ stack and a top electrode.

Referring now to FIG. 7, there is illustrated the exemplary MTJ containing device of FIG. 6 after forming a multilayered MTJ stack 26 and a top electrode 34. As is shown, the multilayered MTJ stack 26 is formed on a physically exposed topmost surface of both the DLC layer 14 and the bottom electrode 24, and the top electrode 34 is formed on a topmost surface of the multilayered MTJ stack 26. The top electrode 34 is positioned directly over the bottom electrode 24 and the underlying electrically conductive structure 12.

The MTJ stack 26 includes at least a magnetic reference layer 28, a tunnel barrier layer 30, and a magnetic free layer 32, as configured in FIG. 1. Other MTJ stack 26 configurations are possible such as, for example, the magnetic free layer 32 being located at the bottom of the MTJ stack 26 and the magnetic reference layer 28 being at the top of the MTJ stack. In some embodiments (not shown), the MTJ stack 26 may also include a non-magnetic spacer layer located on the magnetic free layer, a second magnetic free layer located on the non-magnetic spacer layer, and/or a MTJ cap layer located on the magnetic free layer 32 or on the second magnetic free layer. The various material layers of the MTJ stack 26 can be formed by utilizing one or more deposition processes such as, for example, plating, sputtering, plasma enhanced atomic layer deposition (PEALD), plasma enhanced chemical vapor deposition (PECVD) or physical vapor deposition (PVD).

The magnetic reference layer 28 has a fixed magnetization. The magnetic reference layer 28 may be composed of a metal or metal alloy (or a stack thereof) that includes one or more metals exhibiting high spin polarization. In alternative embodiments, exemplary metals for the formation of the magnetic reference layer 28 include iron, nickel, cobalt, chromium, boron, or manganese. Exemplary metal alloys may include the metals exemplified by the above. In another embodiment, the magnetic reference layer 28 may be a multilayer arrangement having (1) a high spin polarization region formed from of a metal and/or metal alloy using the metals mentioned above, and (2) a region constructed of a material or materials that exhibit strong perpendicular magnetic anisotropy (strong PMA). Exemplary materials with strong PMA that may be used include a metal such as cobalt, nickel, platinum, palladium, iridium, or ruthenium, and may be arranged as alternating layers. The strong PMA region may also include alloys that exhibit strong PMA, with exemplary alloys including cobalt-iron-terbium, cobalt-iron-gadolinium, cobalt-chromium-platinum, cobalt-platinum, cobalt-palladium, iron-platinum, and/or iron-palladium. The alloys may be arranged as alternating layers. In one embodiment, combinations of these materials and regions may also be employed.

The tunnel barrier layer 30 is composed of an insulator material and is formed at such a thickness as to provide an appropriate tunneling resistance. Exemplary materials for the tunnel barrier layer 30 include magnesium oxide, aluminum oxide, and titanium oxide, or materials of higher electrical tunnel conductance, such as semiconductors or low-bandgap insulators.

The magnetic free layer 32 may be composed of a magnetic material (or a stack of magnetic materials) with a magnetization that can be changed in orientation relative to the magnetization orientation of the magnetic reference layer 28. Exemplary magnetic materials for the magnetic free layer 32 include alloys and/or multilayers of cobalt, iron, alloys of cobalt-iron, nickel, alloys of nickel-iron, and alloys of cobalt-iron-boron.

If present, the non-magnetic metallic spacer layer is composed of a non-magnetic metal or metal alloy that allows magnetic information to be transferred therethrough and also permits the two magnetic free layers to couple together magnetically, so that in equilibrium the first and second magnetic free layers are always parallel. The non-magnetic metallic spacer layer allows for spin torque switching between the first and second magnetic free layers.

If present, the second magnetic free layer may include one of the magnetic materials mentioned above for magnetic free layer 32. In one embodiment, the second magnetic free layer is composed of a same magnetic material as the magnetic free layer 32. In another embodiment, the second magnetic free layer is composed of a magnetic material that is compositionally different from the magnetic free layer 32.

If present, the MTJ cap layer can be composed of Nb, NbN, W, WN, Ta, TaN, Ti, TiN, Ru, Mo, Cr, V, Pd, Pt, Rh, Sc, Al or other high melting point metals or conductive metal nitrides. The MTJ cap layer may have a thickness from 2 nm to 25 nm; other thicknesses are possible and can be used in the present application as the thickness of the MTJ cap layer.

The top electrode 34 may be composed of one of the conductive materials mentioned above for the bottom electrode 24. In one embodiment, the conductive material that provides the top electrode 34 is compositionally different from the bottom electrode 24. In another embodiment, the conductive material that provides the top electrode 34 is compositionally the same as the bottom electrode 24. The conductive material that provides the top electrode 34 is typically compositionally different from the optional MTJ cap layer. The top electrode 34 can have a thickness from 5 nm to 25 nm. The top electrode 34 may be formed utilizing one of the deposition processes mentioned above in providing the conductive material layer 24L, followed by performing a patterning process, such as, for example, photolithography and etching.

Figure 8:
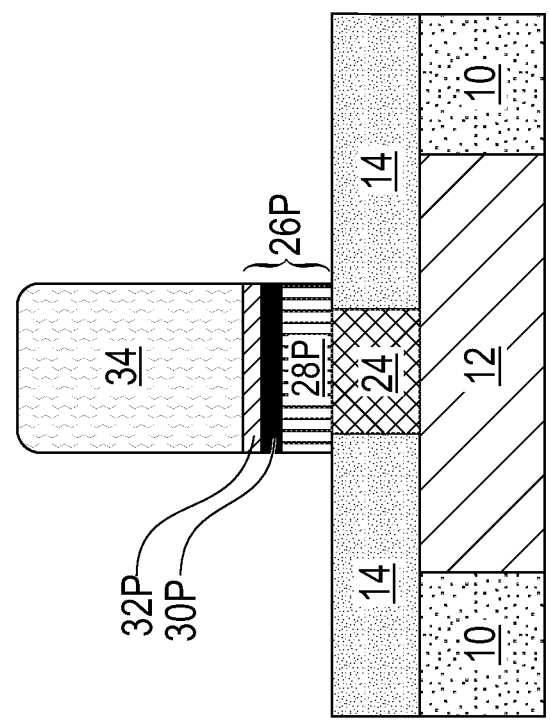
FIG. 8 is a cross sectional view of the exemplary MTJ containing device of FIG. 7 after etching the multilayered MTJ stack utilizing the top electrode as an etch mask to provide a MTJ pillar.

Referring now to FIG. 8, there is illustrated the exemplary MTJ containing device of FIG. 7 after etching the multilayered MTJ stack 26 utilizing the top electrode 34 as an etch mask to provide a MTJ pillar 26P. The etching of the multilayered MTJ stack 26 comprises one or more etching processes. The one or more etching processed may include one or more reactive ion etching processes. The MTJ pillar 26P and the top electrode 34 are typically cylindrical in shape. However, other asymmetric shapes are possible and can be utilized in the present application.

The MTJ pillar 26P has a sidewall that is vertically aligned to the sidewall of the top electrode 34. The MTJ pillar 26P includes at least a remaining portion of the magnetic reference layer 28 (hereinafter magnetic reference material 28P), a remaining portion of the tunnel barrier layer 30 (hereinafter tunnel barrier material 30P) and a remaining portion of the magnetic free layer 32 (hereinafter magnetic free material 32P). In some embodiments, the MTJ pillar 26P may also include a remaining portion of the non-magnetic spacer, a remaining portion of the second magnetic reference layer, and/or a remaining portion of the MTJ cap layer.

As is shown, the bottom electrode 24 has a smaller critical dimension than a critical dimension of the MTJ pillar 26P and the top electrode 34. As such, a portion of the MTJ pillar 26P directly contacts a topmost surface of the DLC layer 14, while the majority of the MTJ pillar 26P forms an interface with the bottom electrode 24. As is shown, no portion of the bottom electrode 24 is physically exposed. Also, the DLC layer 14 is not affected by this etching step thus the electrically conductive structure 12 is not physically exposed.

At this point of the present application, a passivation/encapsulation dielectric material (not shown) may be formed along the sidewalls of the MTJ pillar 26P, and the top electrode 34 utilizing techniques and dielectric materials that are well known to those skilled in the art.

Figure 9:
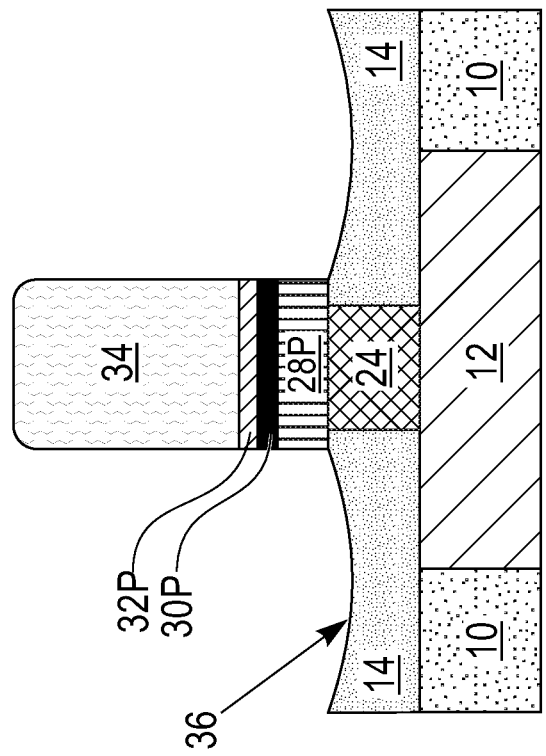
FIG. 9 is a cross sectional view of the exemplary MTJ containing device of FIG. 8 after cleaning the sidewall of the MTJ pillar utilizing an ion beam etch.

Referring now to FIG. 9, there is illustrated the exemplary MTJ containing device of FIG. 8 after cleaning the sidewall of the MTJ pillar utilizing an ion beam etch (IBE). The ion beam etch is performed at an angle that is typically from 20° to 45° from a horizontal surface. During the IBE, an upper portion of the DLC layer 14 that is located at the footprint of the MTJ pillar 26P may be removed to provide a recessed region 36 in the DLC layer 14. The recessed region 36 of the DLC layer 14 may have a concave surface as shown in FIG. 9. Due to the small critical dimension of the bottom electrode 24 that is afforded by the method of the present application, no portion of the bottom electrode 24 is physically exposed and thus no resputtered conductive metal particles from the bottom electrode 24 (or the electrically conductive structure 12) deposit on the sidewalls of the MTJ pillar 26P. Thus, and in the present application, reduction of electrical shorts and improved device performance, in terms of a reduction in failure mode, can be obtained.

Although not shown, another electrically conductive structure can be formed contacting a surface of the top electrode 34. This other electrically conductive structure is embedded in another interconnect dielectric material that is formed laterally adjacent to, and above, the MTJ pillar 26P and the top electrode 34.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A magnetic tunnel junction (MTJ) containing device comprising:
   a MTJ pillar located on a topmost surface of a bottom electrode, wherein a diamond like carbon (DLC) layer is located laterally adjacent to the bottom electrode; and
   a top electrode located on the MTJ pillar.

2. The MTJ containing device of claim 1, wherein the bottom electrode is located on a topmost surface of an electrically conductive structure that is embedded in an interconnect dielectric material layer.

3. The MTJ containing device of claim 2, wherein the DLC layer is present on the entirety of the topmost surface of the interconnect dielectric material layer, and wherein a portion of the DLC layer extends onto the topmost surface of the electrically conductive structure.

4. The MTJ containing device of claim 1, wherein the bottom electrode has a critical dimension from 20 nm to 60 nm.

5. The MTJ containing device of claim 1, wherein the MTJ pillar comprises a magnetic reference material, a tunnel barrier material, and a magnetic free material, wherein the magnetic reference material forms an interface with the bottom electrode.

6. The MTJ containing device of claim 1, wherein no resputtered conductive metal particles are present on a sidewall of the MTJ pillar.

7. The MTJ containing device of claim 1, wherein the bottom electrode has a smaller critical dimension than a critical dimension of the MTJ pillar and the top electrode.

8. The MTJ containing device of claim 7, wherein a portion of the MTJ pillar directly contacts a topmost surface of the DLC layer.

9. The MTJ containing device of claim 1, wherein the DLC layer has a recessed region located at a footprint of the MTJ pillar.

10. The MTJ containing device of claim 9, wherein the recessed region of the DLC layer has a concave surface.

* * * * *